United States Patent [19]

Ham

[11] 4,079,522

[45] Mar. 21, 1978

[54] APPARATUS AND METHOD FOR CLEANING AND DRYING SEMICONDUCTORS

[75] Inventor: William Edward Ham, Mercerville, N.J.

[73] Assignee: RCA Corporation, New York, N.Y.

[21] Appl. No.: 726,058

[22] Filed: Sep. 23, 1976

[51] Int. Cl.² .............................................. F26B 3/34
[52] U.S. Cl. .......................................... 34/1; 34/12; 34/60; 34/68; 219/271; 134/11; 134/30
[58] Field of Search .......................... 34/1, 12, 60, 68; 13/22; 219/271; 134/11, 30; 156/612, 613, 614

[56] References Cited

U.S. PATENT DOCUMENTS

| | | | |
|---|---|---|---|
| 3,717,439 | 2/1973 | Sakai | 13/22 |
| 3,845,270 | 10/1974 | Widugris | 34/1 |

*Primary Examiner*—John J. Camby
*Attorney, Agent, or Firm*—H. Christoffersen; R. P. Williams; D. S. Cohen

[57] ABSTRACT

A semiconductor wafer is cleansed of loose foreign surface matter and chemical impurities near the surface in an apparatus which passes superheated steam over the wafer. Condensate is permitted to form and drip off the wafer. After rising above 100° C the wafer becomes dry, and is removed from the apparatus and then permitted to cool.

7 Claims, 7 Drawing Figures

APPARATUS AND METHOD FOR CLEANING AND DRYING SEMICONDUCTORS

This invention is generally related to methods for cleaning and drying semiconductor wafers before subsequent processing into integrated circuits and other devices. It is specifically related to methods for cleaning a semiconductor material such as silicon, gallium arsenide, germanium or the like with superheated steam using controlled variations in the temperature of the semiconductor.

In the process of manufacturing an integrated semiconductor circuit or semiconductor device using a semiconductor wafer various impurities are diffused therein and layers of materials such as metallization layers are formed thereon. It is necessary prior to these steps to free the surface of solid matter, films of chemical impurities and solvents which may have been absorbed or adsorbed during prior cleansing and processing steps. For example, usually, during the manufacture of semiconductor devices, the semiconductor wafer is cleaned in alcohol to remove any contaminants which may be on the surface of the wafer. Sometimes a wafer absorbs some of the alcohol. One method which has been used to remove this material is the passage of distilled water over the surface of the wafer.

Also, sometimes alcohol is used as a final solvent and cleansing agent and the semiconductor wafers are stored therein prior to processing the wafer into operable devices.

Figure 1A:
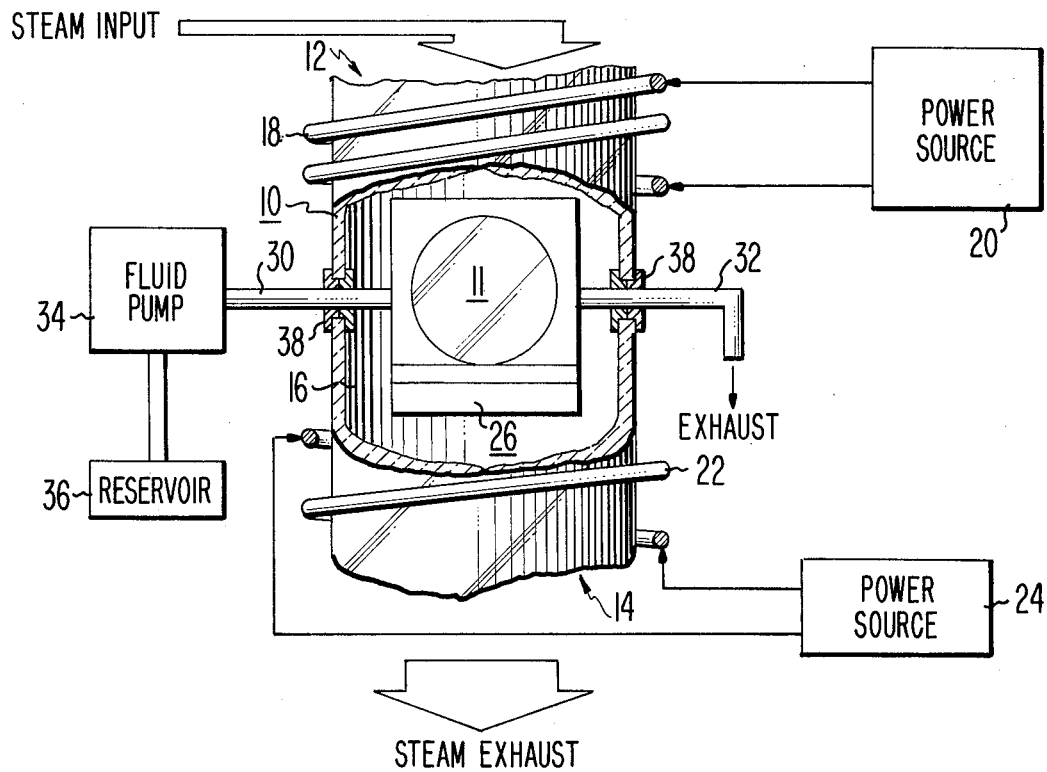
Figure 1B:
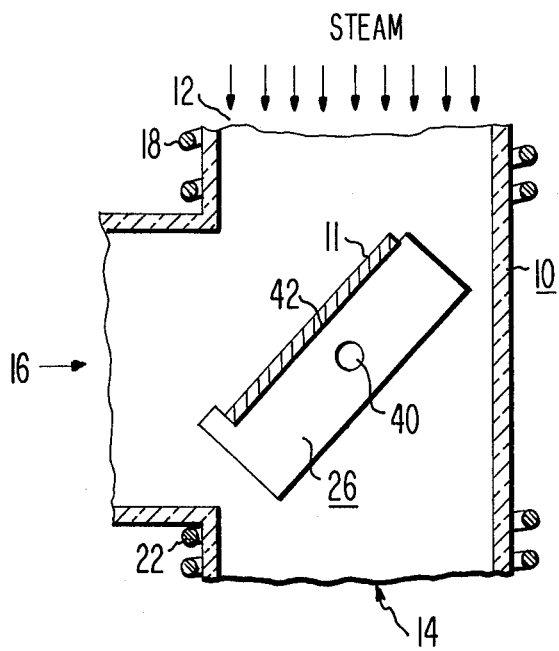
Figure 2A:
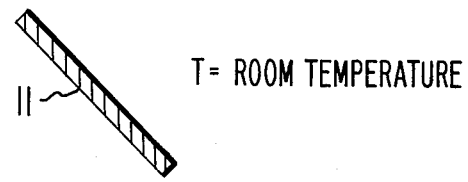
Figure 2B:
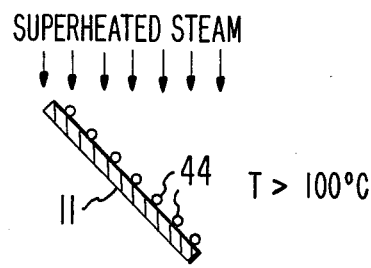
Figure 2C:
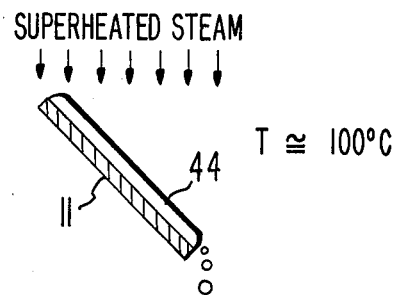
Figure 2D:
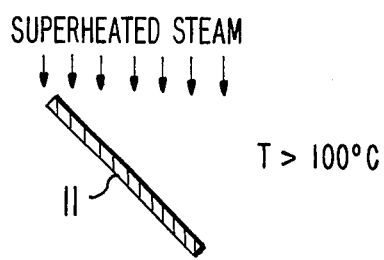
Figure 2E:
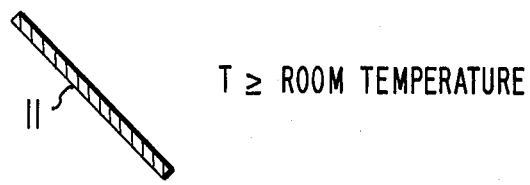

FIGS. 1 (a) and 1(b) illustrate an embodiment of a novel apparatus which may be used to carry out steps of the novel method; and FIGS. 2 (a) through 2 (e) illustrate steps in the novel method.

Superheated steam is water vapor at a higher temperature than 100° C. Superheated steam is produced when steam as water vapor is lead away from boiling water and heated.

The novel apparatus for the method is illustrated in FIG. 1 (a) wherein there is shown a chamber 10 for receiving a semiconductor wafer 11. The chamber 10 is comprised, for example, of quartz and has an input opening 12 and output opening 14 for the input and exhaust, respectively, of superheated steam. A large quartz tube having an aperture 16 extends perpendicular to the chamber 10. See FIG. 1 (b). The aperture 16 provides a passageway for placing the wafer inside the chamber 10. A heating coil 18 is wrapped around one portion of the chamber 10 and is connected to an electrical power source 20. The source 20 connected with the heating coil 18 heats a portion of the inside of the chamber 10. Similarly, a heating coil 22 wrapped around another portion of the chamber 10 and connected to another electrical power source 24 provides a means for heating this portion of the chamber 10. Both coils 18 and 22 are made of electrically conductive metal wire. The sources 20 and 24 may be radiofrequency power sources.

The sources 20 and 24 and their associated coils 18 and 22 are used to maintain the inside of the chamber 10 at a specified temperature, for example, 105° to 160° C. This insures that steam at a temperature above 100° C passes over the wafer 11. The heater coils 18 and 22 are turned on and permitted to heat the chamber before the cleaning operation begins.

A holder 26 is provided and adapted for holding the wafer 11. The holder 26 (adapted for cooling by flow of a fluid therethrough) is comprised of a hollow low thermal mass of quartz, for example, and has a quartz input tube 30 connected thereto on one side and another quartz output tube 32 connected to another side. A fluid pump 34 is connected to the input tube and delivers the fluid, for example, water, to the holder 26. The fluid is pumped from a reservoir 36 connected to the pump 34. The fluid is exhausted through the exhaust tube 32. The holder 26 has a passageway (not shown) therethrough which interconnects the tube 30 to the tube 32 providing for the passage of fluid through the holder 26 to cool the holder 26. Grommets 38 comprised of a high temperature polymer, for example Teflon, seal the connection between the chamber 10 and the tubes 30 and 32 exiting therefrom. The seal, the chamber 10, and the tubes 30 and 32 may be improved by means of a silicone grease or other high temperature lubricant placed at the connection.

FIG. 1 (b) is a cross-sectional sideview of the chamber 10 with the holder 26 therein. Steam enters the chamber 10 through the opening 12. The steam is exhausted through the other opening 14 after passing over the wafer 11. The aperture 16 is an access way which is sealed during the cleaning operation and opened to remove the wafer 11 upon completion of the cleaning steps. An orifice 40 is in the holder 26. The orifice 40 is connected to the tube 32.

The temperature is controlled by regulating the electrical power supplied to the coils 18 and 22. The coils 18 and 22 are shown in cross-section wrapped around portions of the chambers 10 above and below the orifice 16.

The chamber 10 may be approximately 15 inches in length and 6 inches in diameter, for example. The orifice 16 may be approximately 6 inches in diameter, for example, and extend approximately 4 inches away from the chamber 10, for example. The electrical power sources 20 and 24 may comprise variable voltage current sources, for example variable transformers, i.e., electrical devices which provide alternating current at various voltages. Heat is produced by passing alternating current through the wire coils 18 and 22 at a preselected voltage. The amount of voltage may be directly correlated to the heat produced from the coils 18 and 22 to control any cycle the temperature in the chamber 10.

The superheated steam for input into the opening 12 of the chamber 10 may be provided, for example, by a steam superheater (not shown). A superheater is a heat transfer surface, tubular in character, for example arranged to receive saturated steam at the inlet of the tubes and to deliver superheated steam steadily at the outlet. Heat is received from a combustion of fuels, for example, by direct radiation to the surface of the superheater tubes or by convection from hot gases, for example, made to flow over the tubes' surfaces, or both. The superheater tubes are made small in diameter to promote maximum contact of the steam with the hot tube wall.

In the operation of this apparatus an inclined surface 42 of the holder 26 shown in FIG. 1 (b) is cooled. This is done by pumping water through the holder 26. The rate at which the water is pumped through the holder 26 can determine the rate of cooling (or heating) of the holder 26 and thereby the temperature of the wafer 11 on it. Any power pump may be used for the fluid pump 34 shown in FIG. 1 (a). The rate of fluid flow through the holder 26 is determined by the rate of operation of the pump 34 which rate may be controlled by the amount of electric power supplied to the pump 34. Variable rate power pumps are known.

The method of the invention is illustrated by FIGS. 2 (a) through 2 (e) shows a semiconductor wafer 11 at a temperature T equal to an initial temperature, room temperature, for example. The initial or starting temperature in this method may range from above 0° C to less than 100° C.

The wafer 11 is placed on the holder 26 of the apparatus (see FIG. 1 (b)) and steam is passed over the wafer (FIG. 2 (b)) while the wafer is maintained at a temperature of less than 100° C. This temperature $T < 100°$ is maintained by passing water through the holder 26 using the fluid pump 34. As steam is passed over an inclined surface of the wafer 11, a condensate 44 forms on the surface thereof. The action of the superheated steam passing over the wafer 11 also heats the wafer 11 and absorbs various impurities which have been previously diffused in the surface, as well as dissolves impurities on the surface of the wafer 11.

Inclining the wafer 11 at an angle away from the vertical such that condensate 44 formed on the inclined surface facing the input of superheated steam washes impurities down the substrate prevents recontamination of upper portions of the surface. The wafer 11 becomes progressively cleaner from top to bottom during this part of the process.

Once sufficient condensate 44 has formed on the surface to thoroughly clean the wafer 11, the fluid pump 34 of FIG. 1 (a) is shut off and the wafer 11 is permitted to rise to a temperature T above or equal to 100° C. Typically about 5 to 120 minutes is required to thoroughly clean a wafer. However, actual times will vary and will depend upon the amount and type of contaminants in and on the wafer. These times may be determined by simple trial and error sample processing of a few wafers from a group or by repetition of the novel cleaning steps for preselected time increments.

FIG. 2 (c) shows superheated steam continuing to pass over the wafer 11. The temperature T of the wafer 11 is approximately equal to 100° C and the condensate 44 drips off the surface.

As illustrated in FIG. 2 (d), once the temperature T of the wafer 11 is greater than 100° C the superheated steam merely passes over the wafer 11 and no condensate is formed. The fluid pump 34 is then shut off and the wafer is raised to a temperature above 100° C, permitted to dry for a period of 3 to 5 minutes and removed from the chamber 10. All water vapor and other substances with a boiling point lower than that of the temperature T of the substrate are evaporated or boiled off after maintaining the temperature T greater than 100° C for a sufficient period of time, such as the 3 to 5 minute period disclosed here.

In FIG. 2 (e) the wafer 11 is shown removed from the superheated steam environment to a cool environment where the temperture of the wafer 11 becomes greater than or equal to the initial temperature but typically less than 100° C. (The wafer 11 is withdrawn from the chamber 10 while at a temperature greater than 100° C. Because the wafer 11 is withdrawn while above 100° C to an environment below 100° C, it is dry when removed.)

I claim:

1. An apparatus for cleaning and drying a semiconductor wafer comprising:
    a. a chamber adapted to receive superheated steam;
    b. means for heating said chamber and maintaining a temperature in said chamber;
    c. a thermal mass located inside said chamber which mass has a flat inclined surface adapted to receive a semiconductor wafer; and
    d. means for controlling the temperature of the thermal mass said means being connected to the mass.

2. The apparatus of claim 1 wherein said mass has an aperture therein adapted for flow of cooling fluid therethrough.

3. The apparatus of claim 2 wherein said means for controlling the temperature comprises a tube connected to said aperture.

4. The apparatus of claim 3 wherein said means for heating comprises a coiled electrical conductor adapted to provide heat by the passage of electrical current therethrough.

5. The apparatus of claim 4 further comprising means connected to said tube for controlling the flow of fluid through the tube.

6. The apparatus of claim 5 further comprising means connected to said conductor for controlling the passage of current therethrough.

7. The apparatus of claim 6 wherein the mass, chamber, and conduit are quartz.

* * * * *